(12) United States Patent
Mondot (10) Patent No.: US 9,261,544 B2
(45) Date of Patent: Feb. 16, 2016

(54) VA METERING IN DELTA-WIRED ELECTRICAL SERVICE

(71) Applicant: Landis+Gyr, Inc., Lafayette, IN (US)

(72) Inventor: Daniel Mondot, Lafayette, IN (US)

(73) Assignee: Landis+Gyr, Inc., Lafayette, IN (US)

( * ) Notice: Subject to any disclaimer, the term of this patent is extended or adjusted under 35 U.S.C. 154(b) by 483 days.

(21) Appl. No.: 13/862,203

(22) Filed: Apr. 12, 2013

(65) Prior Publication Data

US 2014/0309954 A1   Oct. 16, 2014

(51) Int. Cl.
*G01R 21/00* (2006.01)
*G01R 22/10* (2006.01)
*G01R 21/133* (2006.01)

(52) U.S. Cl.
CPC ............ *G01R 22/10* (2013.01); *G01R 21/1331* (2013.01)

(58) Field of Classification Search
CPC .... G01D 4/002; G01R 21/06; G01R 21/1331; Y02B 90/248; Y04S 20/52; Y04S 40/126; Y02E 60/7853
USPC .................................... 702/57, 60–62, 64, 65
See application file for complete search history.

(56) References Cited

U.S. PATENT DOCUMENTS

| | | | |
|---|---|---|---|
| 6,778,920 B1 * | 8/2004 | Balch ..................... | G01R 22/10 324/142 |
| 7,747,400 B2 * | 6/2010 | Voisine .............. | G01R 21/1331 324/107 |
| 8,731,854 B2 * | 5/2014 | Martin ................... | G01D 4/002 702/61 |

* cited by examiner

*Primary Examiner* — An Do
(74) *Attorney, Agent, or Firm* — Maginot, Moore & Beck LLP (57) ABSTRACT

An arrangement includes an A/D converter and a processing circuit. The A/D converter is configured to generate digital samples of voltage and current waveforms in a polyphase electrical system. The processing circuit is operably coupled to receive the digital samples from the A/D converter. The processing circuit configured is to obtain contemporaneous phase current and voltage samples $I_A$, $I_B$, $I_C$ and/or $I_N$, and $V_A$, $V_B$, $V_C$. The processing circuit is further configured to determine at least $I_{CB}$ sample values based on three of the current samples of $I_A$, $I_B$, $I_C$, and $I_N$, and determine a VA value based at least in part on $I_{CB}$. The processing circuit is further configured to provide information representative of the VA calculation to one of a group consisting of a display, a communication circuit, a memory and a billing calculation unit.

16 Claims, 5 Drawing Sheets

VA METERING IN DELTA-WIRED ELECTRICAL SERVICE

FIELD OF THE INVENTION

The present invention relates generally to electricity measurements, and more particularly, to apparent power (VA) and apparent energy (VAh) measurements.

BACKGROUND

One of the goals of electricity metering is to accurately measure the use or consumption of electrical energy resources. With such measurements, the cost of generating and delivering electricity may be allocated among consumers in relatively logical manner. Another goal of electricity metering is help identify electrical energy generation and delivery needs. For example, cumulative electricity consumption measurements for a service area can help determine the appropriate sizing of transformers and other equipment.

Electricity metering often involves the measurement of consumed power or energy in the form of watts or watt-hours. Real energy or active energy measurements (expressed in watt-hours or wh) relate directly to the actual energy that the load requires. However, the amount of watts supplied to a load does not necessarily reflect the amount of power that must be produced by the source. In particular, the amount of load watts, or load watt-hours, does not necessarily accurately relate to the size of the service (transformers size, size of power lines, etc.) needed to supply the load. This is due in part to loads that have significant capacitive and/or inductive components. In such loads, the actual energy consumption in watt-hours can be significantly less than the apparent energy (expressed as "VA-hours" or "VAh") that must be produced by the energy source.

For example, consider two loads: a first load consuming 240 watts at 120 volts and which is completely resistive, and a second load consuming 240 watts at 120 volts and having a phase difference between voltage and current of 30°. Using the basic AC power consumption equation $$\text{Watts} = V_{rms} I_{rms} \cos \theta, \quad (1)$$

, where $\theta$ is the phase angle between voltage and current, it can be seen that the first load requires 2 amps of current because $I = 240/(120 \cdot \cos 0°)$, while the second load requires 2.31 amps of current because $I = 240/(120 \cdot \cos 30°)$. While the actual watt-hour consumption of the second load is the same as the first load, the second load requires more current, which can affect sizing of power lines, transformers, etc. Consequently, it can be desirable to measure VA or VAh to help in determining the size of the source, i.e. transformers size, size of the power lines, etc., needed to supply the load.

Moreover, in a case of a customer that consumes significantly more VA than watts, the metering of only watt-hours will not accurately identify the customer's proportional cost of the power delivery equipment. For this reason a more complex rate structure involving VA or VA-hours is often used to recover the investment costs for such items as transformers and power lines etc. providing energy to the load. As a consequence, many electricity meters, particularly for larger non-residential loads, have at least some capability to measure VA or VA-hours.

The calculation of VA or VA-hours in single phase systems is relatively straight forward when the signals are pure sine waves. However, if harmonics are present in the power line signal, then the calculations of VA and the practical significance of the calculated VA becomes more complex.

One common method of calculating VA involves multiplying the RMS voltage by the RMS current, or in other words $VA = V_{RMS} \cdot I_{RMS}$. Converting VA to VA-hours, as is well known in the art, merely involves integrating the VA values over time. For example, the VA value may be calculated at 0.333 second intervals, with each calculation considered to be the VA consumption over that 0.333 second, or approximately $1/10{,}800^{th}$ of an hour. These values are then accumulated to provide a running meter of consumed VA-hours. Because such calculations are routine, the terms VA and VA-hours may be used somewhat interchangeably herein, with the understanding that VA-hours may always be calculated from VA values.

In any event, a second common method of calculating VA involves first determining the value of the reactive power, also known as VAR (Volt Amp Reactive), and the real or active power in watts. The VAR value may be calculated using the equation $VAR = V_{RMS} \cdot I_{RMS} \cdot \sin \theta$, or by sampling voltage and current and multiplying samples of voltage and current that are 90° phase separated in the AC line cycle. The method then involves deriving VA using the formula $VA = \sqrt{\text{Watt}^2 + VAR^2}$. If harmonics are present in the power line signal, then the use of the formula $VA = \sqrt{\text{Watt}^2 + VAR^2}$ to calculate VA will yield a result that is less than that calculated from the RMS values of voltage and current, $VA = V_{RMS} \cdot I_{RMS}$. Because of this inaccuracy, sometimes a 3$^{rd}$ quantity, distortion power (DP) is sometimes added as follows:

$$VA = \sqrt{\text{Watt}^2 + VAR^2 + DP^2}. \quad (2)$$

The above equations relate generally to single phase systems. In a polyphase system, the calculation of VA is more complex and the practical significance of what is calculated goes beyond that of single phase systems. In particular, the two methods of calculating VA (or VAh) described above for single phase systems do not necessarily yield the same results if applied to polyphase systems even under conditions of pure sine wave signals.

In one method, VA is calculated from the RMS values of the individual phase voltages and currents for each of a polyphase system, and then the VA value for the different phases is totaled. In other words, the VA of each phase is determined using $VA = V_{RMS} \cdot I_{RMS}$ and then the total VA is calculated by simply adding the individual VA of each phase. This method of calculating VA is sometimes referred to as "RMS VA" ($VA_{RMS}$) or "arithmetic VA". Arithmetic VA is identified as being most accurate with respect to the source or service side of the electrical system, and not the load side.

In another method, the VA is calculated using watts and VAR. In this method, the total amount of watts for all three phases is determined, and the amount of VAR for all three phases is determined. The total VA is then calculated using the formula $VA = \sqrt{\text{Watt}^2 + VAR^2}$ where Watt and VAR represent the total load watt and VAR respectively. This method of calculating VA is sometimes referred to as "vector VA" ($VA_V$). Vector VA is considered to be more accurate with the load side of the electrical system.

Further detail regarding the calculation of arithmetic or source VA and the calculation of vector or load VA for many types of electrical service is provided in U.S. Pat. No. 7,747,400, which is incorporated herein by reference in its entirety. In U.S. Pat. No. 7,747,400, a meter is disclosed that includes various methods of calculating that can be selected by a technician.

While the meter disclosed in U.S. Pat. No. 7,747,400 provides many useful metered VA values, it does not provide a source or arithmetic VA calculation for four-wire delta electrical services. Accordingly, there is a need for a meter that can calculate, among other things, VA in four-wire delta electrical services. Other known methods are inaccurate, particularly for unbalanced loads.

A particular need is for a method of measuring VA that accurately estimates or represents the VA at the source, which can provide better information for the sizing of transformers and other equipment.

SUMMARY OF THE INVENTION

A first aspect of the invention is a meter that is operable to implement an appropriate VA calculation within an electricity meter in a four-wire service based on values normally measurable and available within the meter.

At least one embodiment of the invention is an arrangement that includes an A/D converter and a processing circuit. The A/D converter is configured to generate digital samples of voltage and current waveforms in a polyphase electrical system. The processing circuit is operably coupled to receive the digital samples from the A/D converter. The processing circuit configured is to obtain contemporaneous phase current and voltage samples $I_A$, $I_B$, $I_C$ and/or $I_N$, and $V_A$, $V_B$, $V_C$. The processing circuit is further configured to determine at least $I_{CB}$ sample values based on three of the current samples of $I_A$, $I_B$, $I_C$, and $I_N$, and determine a VA value based at least in part on $I_{CB}$. The processing circuit is further configured to provide information representative of the VA calculation to one of a group consisting of a display, a communication circuit, a memory and a billing calculation unit.

In another embodiment, the processing circuit is further configured to generate the $I_{CB}$ sample value based on the equation $\frac{1}{6}I_B - \frac{1}{6}I_A + \frac{1}{2}I_C$. In still other embodiments, the processing circuit is further configured to generate a plurality of the $I_{CB}$ sample values, and generate a magnitude value of the plurality of the $I_{CB}$ sample values.

In another embodiment, the processing circuit is further configured to determine the VA value further using a magnitude of the voltage from phase C to phase B, and is configured to obtain the voltage magnitude by generating a plurality of the $V_{CB}$ sample values, each $C_{CB}$ sample value comprising a difference between a phase C sample and a contemporaneous phase B sample, and generating a $V_{CB}$ magnitude value using the plurality of the $V_{CB}$ sample values.

In yet another embodiment, the processing circuit then determines the VA value based at least in part on the product of the generated magnitude value of the current from phase C to phase B on the source side, and a magnitude of a voltage from phase C to phase B.

In another embodiment, the processing circuit is further configured to generate an $I_{CA}$ sample value based on the equation $\frac{1}{6}I_B - \frac{1}{6}I_A + \frac{1}{2}I_C$. In still other embodiments, the processing circuit is further configured to generate a plurality of the $I_{CA}$ sample values, and generate a magnitude value of the plurality of the $I_{CA}$ sample values.

In another embodiment, the processing circuit is further configured to determine the magnitude of the voltage from phase C to phase A by generating a plurality of the $V_{CA}$ sample values, each $V_{CA}$ sample value comprising a difference between a phase C sample and a contemporaneous phase A sample, and generating a $V_{CA}$ magnitude value using the plurality of the $V_{CA}$ sample values.

In yet another embodiment, the processing circuit then determines the VA value based at least in part on the product of the generated magnitude value of the current from phase C to phase A on the source side, and a magnitude of a voltage from phase C to phase A.

In another embodiment, the processing circuit is further configured to generate the $I_{BN}$ sample value based on the equation $\frac{5}{6}I_B + \frac{1}{6}I_A + \frac{1}{2}I_C$. In still other embodiments, the processing circuit is further configured to generate a plurality of the $I_{BN}$ sample values, and generate a magnitude value of the plurality of the $I_{BN}$ sample values.

In yet another embodiment, the processing circuit then determines the VA value based at least in part on the product of the generated magnitude value of the current from phase B to neutral on the source side, and a magnitude of a voltage on phase B.

In another embodiment, the processing circuit is further configured to generate the $I_{AN}$ sample value based on the equation $\frac{5}{6}I_A + \frac{1}{6}I_B + \frac{1}{2}I_C$. In still other embodiments, the processing circuit is further configured to generate a plurality of the $I_{AN}$ sample values, and generate a magnitude value of the plurality of the $I_{AN}$ sample values.

In yet another embodiment, the processing circuit then determines the VA value based at least in part on the product of the generated magnitude value of the current from phase A to neutral on the source side, and a magnitude of a voltage on phase A.

In some embodiments, the processing circuit is further configured to generate the VA value based on the equation:

$$VA = |\vec{V_{CB}}| * |\vec{I_{CB}}| + |\vec{V_{CA}}| * |\vec{I_{CA}}| + |\vec{V_B}| * |\vec{I_{BN}}| + |\vec{V_A}| * |\vec{I_{AN}}|$$

wherein $\vec{V_{CB}}$ is a vector value of the voltage from phase C to phase B, $\vec{I_{CB}}$ is vector value representative of the current from phase C to phase B at the source, $\vec{V_{CA}}$ is a vector value of the voltage from phase C to phase A, $\vec{I_{CA}}$ is a vector value representative of the current from phase C to phase A at the source, $\vec{V_B}$ is a vector value of the voltage from phase B to neutral, $\vec{I_{BN}}$ is a vector value representative of the current from phase B to neutral at the source, $\vec{V_A}$ is a vector value of the voltage from phase A to neutral, and $\vec{I_{AN}}$ is a vector value representative of the current from phase A to neutral at the source.

The above described features and advantages, as well as others, will become more readily apparent to those of ordinary skill in the art by reference to the following detailed description and accompanying drawings.

DETAILED DESCRIPTION

Figure 1:
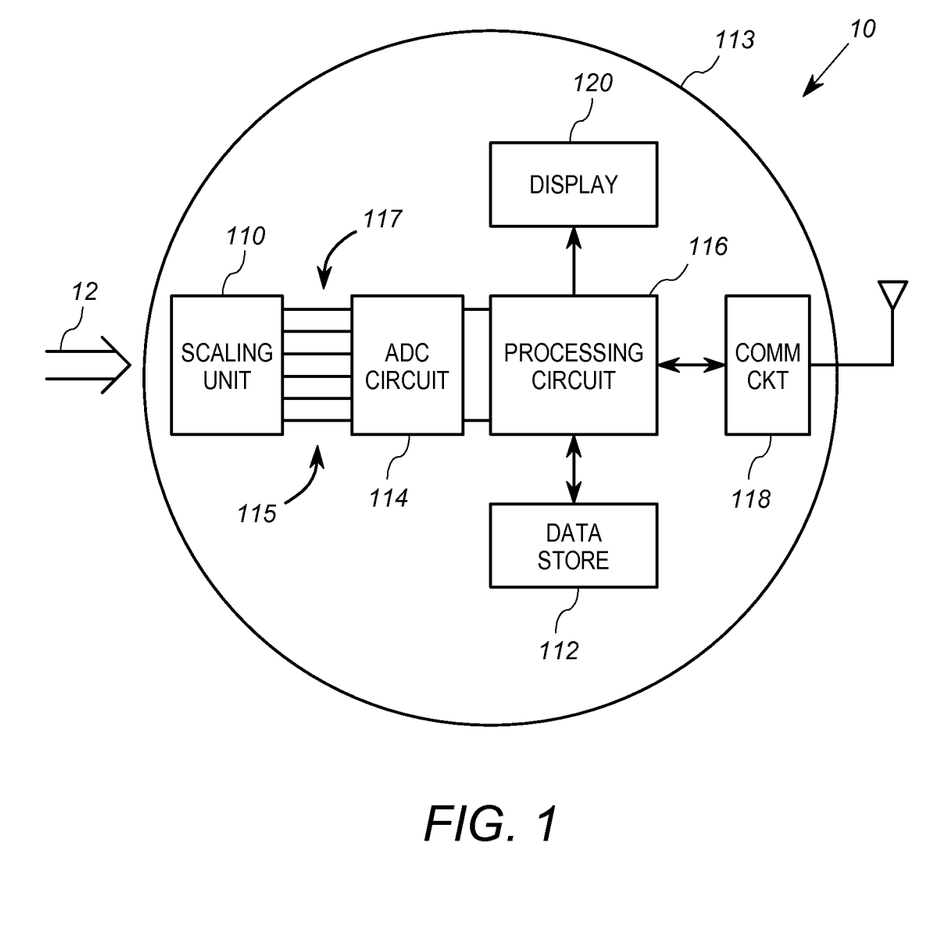
FIG. 1 shows an exemplary meter that may be used in one or more embodiments of the present invention.

FIG. 1 shows an exemplary embodiment of a polyphase electricity meter 10 in which an arrangement according the invention is implemented. Referring to FIG. 1 specifically, the meter 10 is an apparatus for measuring energy consumption that includes a scaling circuit 110, an analog-to-digital conversion ("ADC") circuit 114, a processing circuit 116, a communication circuit 118, an optional display 120 and a data store 112. All of the above listed elements are preferably supported by a meter housing 113, which may take a plurality of known forms. The communication circuit 118 may be disposed within an interior of the meter housing 113 like the other devices, or may be affixed to the outside of the meter housing 113.

In the embodiment described herein, the scaling circuit 110 and the ADC circuit 114 are arranged to generate digital signals representative of line voltage waveforms $V_A, V_B, V_C$ for each of three phases A, B, C of a four-wire delta electrical system and other digital signals representative of at least three of the four line current waveforms $I_A, I_B, I_C$ and $I_N$ of the four-wire delta electrical system. As will be discussed below, however, the meter 10 may readily be configured for a three-wire delta electrical service, as well as other types of electrical service. The digital signals are typically sequences of digital samples representative of an instantaneous voltage or current measurement on one phase with respect to either neutral or another phase. Circuits capable of generating such signals are known in the art.

The processing circuit 116 is configured to calculate one or more energy consumption values based on the digital signals. The energy consumption values may be communicated to a remote device using the communication circuit 118, displayed using the display 120, stored in the data store 112, or preferably some combination of the foregoing. In accordance with the embodiments described herein, the processing circuit 116 is further operable to perform any or all of the VA calculations described herein.

In a further detailed description of the meter 10 of FIG. 1, the scaling circuit 110 may suitably comprise current and voltage sensors, not shown. The voltage sensors, which may, for example, include voltage dividers, generate a scaled down version of the voltage present on phases of the power lines 12. The current sensors, which may suitably include current transformers, shunts, embedded coil devices and the like, generate a voltage or current signal that is a scaled down version of the current present on the phases of the power lines 12. Various voltage and current sensors are known in the art.

The ADC circuit 114 includes one or more analog-to-digital converters that convert the scaled measurement signals into digital voltage and current measurement signals. Many circuits capable of generating digital voltage and circuit waveform signals are well known in the art. Suitable examples of analog to digital conversion circuits having such capabilities are described in U.S. Pat. Nos. 6,374,188; 6,564,159; 6,121,158 and U.S. Pat. No. No. 5,933,004, all of which are incorporated herein by reference. Moreover, the ADC circuit 114 may readily be a part of an integrated metering chip package, as will be discussed below.

The processing circuit 116 is a device that employs one or more processing devices such as microprocessors, microcontrollers, digital signal processors, discrete digital circuits and/or combinations thereof. As mentioned above, the processing circuit 116 is operable to generate energy consumption data based on the digital signals. In one example, the processing circuit 116 generates watt-hour information based on an accumulation of products of contemporaneous voltage and current samples. For example, true watt-hours for a particular phase may be calculated as the vector product of the current waveform and the voltage waveform. This vector product may be carried out with sampled voltage ($V_n$) and sampled current ($I_n$) by the formula:

$$Whrs = \Sigma V_n * I_n. \tag{3}$$

where Whrs is an accumulated energy value (i.e. watt-hours) for a time frame from a starting time no to a time corresponding to n.

In addition, the processing circuit 116 preferably calculates VA and/or VAh using one or more of the methods described herein. Thus, the processing circuit 116 may generate VA, VAh, watt-hours, VAR-hrs, power factor, root-mean-square voltage and/or current, or combinations of any of the foregoing. Various processing circuits operable to generate energy consumption data from digital voltage and digital current measurement signals are well known in the art. Suitable examples of such circuits are described in U.S. Pat. Nos. 6,374,188; 6,564,159; 6,121,158 and U.S. Pat. No. 5,933,004. However, in one preferred embodiment, the processing circuit is (or includes) a processing element of a metering integrated circuit chip such as the Teridian 71M6533 measurement chip (available from Maxim). In that embodiment, both the ADC circuit 114 and the processing circuit 116 are disposed within the same semiconductor package.

More specifically, the processing circuit 116 in one embodiment is configured (i.e. programmed and/or arranged) to generate a first VA calculation if configuration data identifies that a source VA calculation is selected, the first VA calculation providing a determination of a VA quantity that more accurately represents a source VA than a corresponding determination of a second VA calculation. The processing circuit 116 is also configured to generate a second VA calculation if the configuration data identifies that load VA is selected, the second VA calculation providing a determination of a VA quantity that more accurately represents a load VA than a corresponding determination of the first VA calculation. The configuration data identifying whether a source VA or load VA is to be calculated may suitably be stored in the data store 112 or other memory, or merely be stored in a buffer or register that receives user input or a communication input. The processing circuit 116 is further operable to provide the VA calculation to one of a group consisting of the display 120, the communication circuit 118, and a billing calculation unit within the processing circuit 116 or elsewhere.

To this end, the processing circuit 116 is configured to prompt the user to select either "source VA" or "load VA", or some other indication that VA is to be calculated from the perspective of the electricity source, or from the perspective of the load. The prompting may occur via interactive display using the display 120 and the communication circuit 118, or by other means. For example, the meter 10 may be configured in a configuration facility, not shown, but which are known in the art, where configuration information (e.g. types of measurements to be taken, display features and/or calibration information) is programmed to a memory (i.e. data store 112). In accordance with some embodiments of the invention, the configuration operation would further include selection of "source VA" or "load VA". To this end, the meter display 120 (or an external configuration device display, not shown) would provide the user with a selection of whether a VA calculation should be one that is representative of "source VA", or whether the VA calculation should be one that is representative of "load VA". The user would then program the meter with a selection based on whether source VA or load VA is desired.

When the meter 10 is subsequently installed for use, the meter 10 performs a VA determination based on the stored configuration information of the user selection. If the user had selected source VA, then the processing circuit 116 automatically configures its metering operation to perform an arithmetic VA calculation. If, however, the user had selected load VA, then the processing circuit 116 automatically configures its metering operation to perform a vector VA calculation.

The processing circuit 116 is further operable to store the plurality of energy consumption values in the data store 112. In some embodiments, the processing circuit 116 may store energy consumption values for each of plurality of time periods, in order to allow analysis of energy usage at different times of day, days of the week or month, or even seasonally. The storage of consumption indexed to time periods is often referred to in the industry as "load profiling". The data store 112 may suitably be a random access memory, EEPROM, other memory, or a combination of several types of memory. In still other embodiments, the data store 112 may include a circular buffer, FIFO device, or other memory that stores data in the order in which it is received. Other known methods may be used. In at least some embodiments, the data store 112 includes memory located within the integrated package that houses the processing circuit 116. The data store 112 also includes a software program that is executed by the processing circuit 116 to perform the operations of the processing circuit 116 described herein, including those of FIGS. 3A-3C.

The communication circuit 118 is a device that is in some embodiments configured to communicate data between the metering unit 12 and one or more remote devices. In a system such as that shown in FIG. 1, the communication circuit 118 would be operable to communicate directly or indirectly with a data collection system of a utility service provider. Several of such systems are known. The utility service provider then uses the collected data to generate billing information and/or data forecasting information as is known in the art. To this end, the communication circuit 118 may suitably include a radio, a telephone modem, a power line carrier modem, or other known communication device configured for use with utility meters. Radios may be used that operate in the 100 MHz to 1 GHz range. However, other devices may operate in the kHz or low MHZ range. In addition or in the alternative, the communication circuit 118 is configured to communicate with a locally coupled device, such as a reed switch, portable computing device, or other device. The communication circuit 118 may include an optical or electrical data port, not shown, for this purpose.

The meter display 120, which is optional, may be a digital display such as a liquid crystal display. It will be appreciated that the exact nature of the display is not particularly important to the implementation of the invention. Nevertheless, there is an advantage of including at least some display capabilities. LCD displays, moreover, have been found to have a particularly advantageous set of qualities for use in electronic meters.

As discussed above, the processing circuit 116 in one embodiment is configured to generate a selected one of a source VA value or a load VA value. This value may be used for billing purposes, for planning purposes and/or other analysis purposes. The VA value may be blended with other values, such as watt-hours or watts, or even reactive power.

As also discussed above, if a source VA is to be implemented, then the processing circuit 116 performs an arithmetic VA calculation. If a load VA is to be implemented, then the processing circuit 116 performs a vector VA calculation. As discussed above, as well as in U.S. Pat. No. 7,747,400, the vector VA is a fundamentally different calculation compared to arithmetic VA and sometimes yields different results. In general, the processing circuit 116 may be configured to determine vector or arithmetic VA for single phase, four-wire wye, and three-wire delta systems as discussed in the U.S. Pat. No. 7,747,400. Moreover, the processing circuit 116 may determine the vector VA or load VA as discussed further above and as is known in the prior art. The VA values may suitable be accumulated over time to provide VAh as is known.

However, in contrast to the prior art, at least some embodiments of the invention determine source VA (i.e. and/or VAh) as discussed below in connection with FIGS. 2 and 3A-3C.

Figure 2:
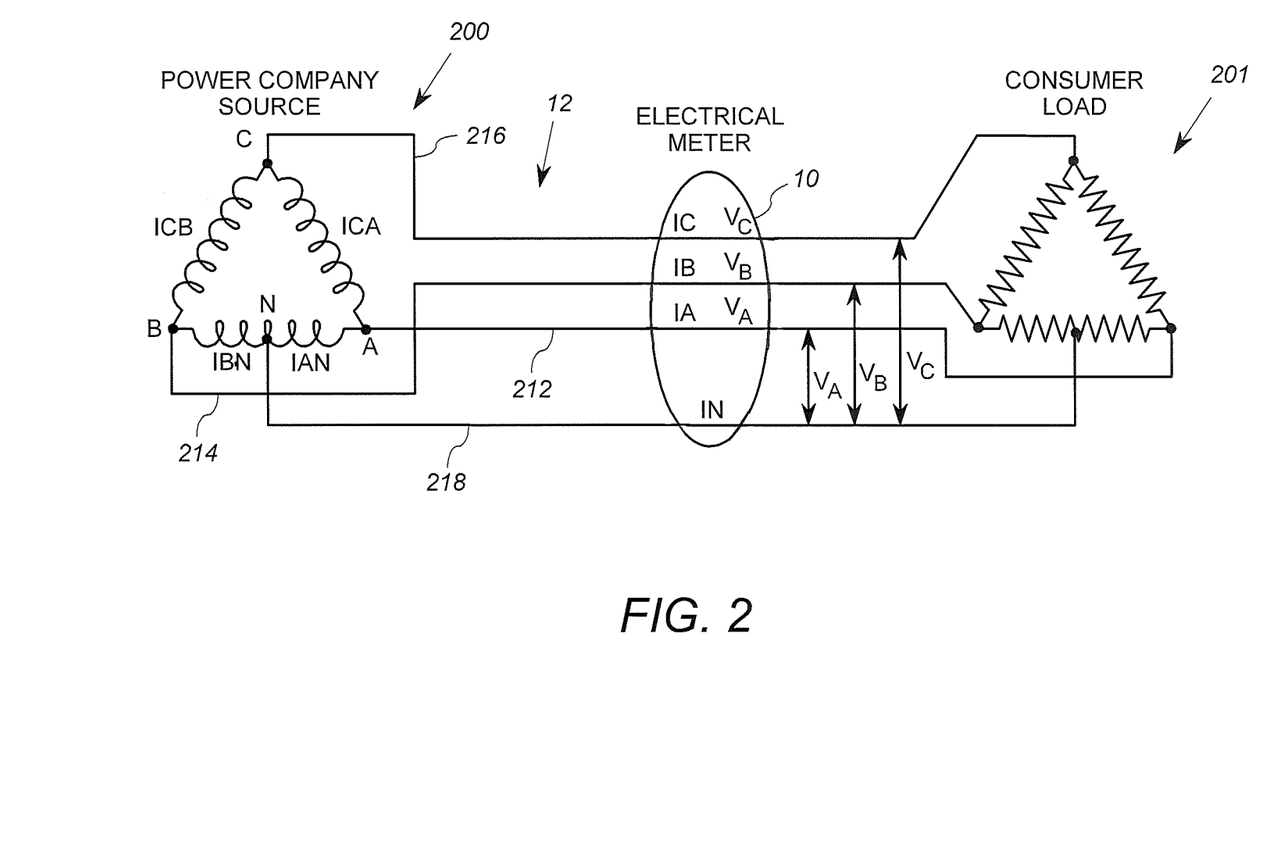
FIG. 2 shows a measurement arrangement in which an embodiment of the invention may be employed.

FIG. 2 show a schematic representation of the meter 10 coupled between a source 200 and a load 201 in a four-wire delta electrical service. The four-wire delta electrical source 200 includes a delta power source (transformer) as is known in the art. The electrical source 200 is operably coupled to provide three-phase delta-wired electrical service to the load 201 via a phase A line 212, a phase B line 214, a phase C line 216 and a neutral line 218 defined between the phase A line 212 and the phase B line 214. As is known in the art, the meter 10 generally meters the energy (and related values) delivered to the load 201 from the source 200. The load 201 includes elements of a customer load, and may include resistive, inductive and/or capacitive loads. The load 201 may be balanced, or may be imbalanced, meaning that different loads may be connected from phase A to phase B, from phase B to phase C, from phase C to phase A, and/or additional loads may be connected from phase A to neutral, phase B to neutral and/or phase C to neutral.

In general, the meter 10 is operably connected to obtain the voltage measurements $V_A$, $V_B$, and $V_C$, and the current measurements $I_A$, $I_B$, $I_C$ and $I_N$. More specifically, the scaling unit 110 is operably coupled to generate voltage measurement signals $V_A$, $V_B$, $V_C$, $I_A$, $I_B$, $I_C$ and $I_N$, and provide those signals to the ADC circuit 114. In several embodiments described herein, only three of the four current values $I_A$, $I_B$, $I_C$ and $I_N$ need be digitized and stored. Typically $I_N$ is not digitized.

The signal $V_A$ represents a scaled version of the voltage from the phase A line 212 to neutral 218. The signal $V_B$ represents a scaled version of the voltage from the phase B line 214 to neutral 218, and the signal $V_C$ represents a scaled version of the voltage from the phase C line 216 to neutral 218. The signal $I_A$ represents a scaled version of the current on the phase A line 212, signal $I_B$ represents a scaled version of the current on the phase B line signal 214, and $I_C$ represents a scaled version of the current on the phase C line 216. The signal $I_N$ represents a scaled version of the current on the neutral line 218.

The ADC circuit 114, in turn, samples each of the waveforms $V_A$, $V_B$, $V_C$, $I_A$, $I_B$, $I_C$ and $I_N$, and generates corresponding digital sample streams $V_A(s)$, $V_B(s)$, $V_C(s)$, $I_A(s)$, $I_B(s)$, $I_C(s)$, and $I_N(s)$. The value s represents a sample index, which corresponds directly to a time increment. The sample rate s/sec is typically many times the cycle frequency of the AC waveform, such that the samples collective provide an accurate sampled representation of the corresponding analog waveform. The operations of the scaling unit 110 and the ADC circuit 114 as discussed above are conventional.

The processing circuit 116 then calculates load watt-hrs by multiplying the voltage vector of each phase with the current vector of each phase, and accumulating the resulting products. Using sampling, the processing circuit 116 may suitably perform the following calculations:

$$\text{Watt-hr}_A = \Sigma(V_A(s) * I_A(s)) \tag{5}$$

$$\text{Watt-hr}_B = \Sigma(V_B(s) * I_B(s)) \tag{6}$$

$$\text{Watt-hr}_C = \Sigma(V_C(s) * I_C(s)) \tag{7}$$

$$\text{Watt-h} = \text{Watt-hr}_A + \text{Watt-hr}_B + \text{Watt-hr}_C \tag{8}$$

wherein $V_x(s)$ is the sampled voltage at a time s on phase x at the meter 10, and $I_x(s)$ is the sampled current at a time s on phase x at the meter 10. In the above equations, the term Watt-hr is actually an energy measurement in terms of watt-hrs.

The processing circuit 116 may suitably calculate vector (or load) VARs using the equation using 90 phase degree delayed current measurements, as is known.

$$VAR_A = \Sigma(V_A(s) * I_A(s-90°)) \tag{9}$$

$$VAR_B = \Sigma(V_B(s) * I_B(s-90°)) \tag{10}$$

$$VAR_C = \Sigma(V_C(s) * I_C(s-90°)) \tag{11}$$

$$VAR = VAR_A + VAR_B + VAR_C \tag{12}$$

With these two values Watt-hr and VAR, the vector Vector_VA may be calculated as:

$$\text{Vector\_VA} = \sqrt{Watt^2 + VAR^2} \tag{13}$$

On the other hand, the processing circuit 116 calculates source VA or arithmetic VA using the following vector equation:

$$SVA = VA = |\vec{V_{CB}}| * |\vec{I_{CB}}| + |\vec{V_{CA}}| * |\vec{I_{CA}}| + |\vec{V_B}| * |\vec{I_{BN}}| + |\vec{V_A}| * |\vec{I_{AN}}| \tag{14}$$

wherein $\vec{V_{CB}}$ is a vector value of the voltage from phase C to phase B, $\vec{I_{CB}}$ is representative of the current from phase C to phase A at the source 200, $\vec{V_{CA}}$ is a vector value of the voltage from phase C to phase A, $\vec{I_{CA}}$ is a vector value representative of the current from phase C to phase A at the source 200, $\vec{V_B}$ is a vector value of the voltage from phase B to neutral, $\vec{I_{BN}}$ is a vector value representative of the current from phase B to neutral at the source 200, $\vec{V_A}$ is a vector value of the voltage from phase A to neutral, and $\vec{I_{AN}}$ is a vector value representative of the current from phase A to neutral at the source 200.

The voltage vectors $$\vec{V_{CB}}, \vec{V_{CA}}, \vec{V_B}, \vec{V_A}$$

may readily be determined in any suitable manner based on the digital measurement signals $V_A(s)$, $V_B(s)$, and $V_C(s)$ received from the ADC circuit 114. The current vectors $$\vec{I_{CB}}, \vec{I_{CA}}, \vec{I_{BN}}, \text{ and } \vec{I_{AN}}$$

are determined as described below:

$$\vec{I_{CB}} = \frac{1}{6}\vec{I_A} - \frac{1}{6}\vec{I_B} + \frac{1}{2}\vec{I_C}. \tag{15}$$

$$\vec{I_{CA}} = \frac{1}{6}\vec{I_B} - \frac{1}{6}\vec{I_A} + \frac{1}{2}\vec{I_C}. \tag{16}$$

$$\vec{I_{BN}} = \frac{5}{6}\vec{I_B} + \frac{1}{6}\vec{I_A} + \frac{1}{2}\vec{I_C}. \tag{17}$$

$$\vec{I_{AN}} = \frac{5}{6}\vec{I_A} + \frac{1}{6}\vec{I_B} + \frac{1}{2}\vec{I_C}. \tag{18}$$

It can be seen that source or arithmetic SVA does not equal load or vector vector_VA in this case. The vector equations for determining SVA are based on the assumption that the internal resistance on each leg of the source 200 is relatively similar. It will further be appreciated that the calculation of source VA or SVA as described above does not require a neutral current measurement.

It will be appreciated that if the current measurement $I_N$ is readily available, then alternative versions of the above referenced equations may be used. In fact, so long as vector values for any three of the currents $I_A$, $I_B$, $I_C$, $I_N$ are available at the load 201 (or anywhere), values representative of the vector currents $$\vec{I_{CB}}, \vec{I_{CA}}, \vec{I_{BN}}, \text{ and } \vec{I_{AN}}$$

at the source can be generated. In particular, the current vectors, $$\vec{I_{CB}}, \vec{I_{CA}}, \vec{I_{BN}}, \text{ and } \vec{I_{AN}}$$

may alternatively be determined implementing the following vector equations:

$$\vec{I_{CB}} = \frac{1}{3}\vec{I_A} + \frac{1}{6}\vec{I_N} + \frac{2}{3}\vec{I_C}. \tag{19}$$

$$\vec{I_{CA}} = \frac{1}{3}\vec{I_B} + \frac{1}{6}\vec{I_N} + \frac{2}{3}\vec{I_C}. \tag{20}$$

$$\vec{I_{BN}} = \frac{2}{3}\vec{I_B} - \frac{1}{6}\vec{I_N} + \frac{1}{3}\vec{I_C}. \tag{21}$$

$$\vec{I_{AN}} = \frac{2}{3}\vec{I_A} - \frac{1}{6}\vec{I_N} + \frac{1}{3}\vec{I_C}. \tag{22}$$

In another alternative, using only $I_A$, $I_C$ and $I_N$, the current vectors, $$\vec{I_{CB}}, \vec{I_{CA}}, \vec{I_{BN}}, \text{ and } \vec{I_{AN}}$$

may also be determined:

$$\vec{I_{CB}} = \frac{1}{3}\vec{I_A} + \frac{1}{6}\vec{I_N} + \frac{2}{3}\vec{I_C}. \tag{23}$$

$$\vec{I_{CA}} = -\frac{1}{3}\vec{I_A} - \frac{1}{6}\vec{I_N} + \frac{1}{3}\vec{I_C}. \tag{24}$$

$$\vec{I_{BN}} = -\frac{2}{3}\vec{I_A} - \frac{5}{6}\vec{I_N} - \frac{1}{3}\vec{I_C}. \tag{25}$$

$$\vec{I_{AN}} = \frac{2}{3}\vec{I_A} - \frac{1}{6}\vec{I_N} + \frac{1}{3}\vec{I_C}. \tag{26}$$

In yet another alternative, using only $I_B$, $I_C$ and $I_N$, the current vectors, $\vec{I_{CB}}, \vec{I_{CA}}, \vec{I_{BN}},$ and $\vec{I_{AN}}$ may also be determined:

$$\vec{I_{CB}} = -\frac{1}{3}\vec{I_B} - \frac{1}{6}\vec{I_N} + \frac{1}{3}\vec{I_C}. \tag{27}$$

$$\vec{I_{CA}} = \frac{1}{3}\vec{I_B} + \frac{1}{6}\vec{I_N} + \frac{2}{3}\vec{I_C}. \tag{28}$$

$$\vec{I_{BN}} = \frac{2}{3}\vec{I_B} - \frac{1}{6}\vec{I_N} + \frac{1}{3}\vec{I_C}. \tag{29}$$

$$\vec{I_{AN}} = -\frac{2}{3}\vec{I_B} - \frac{5}{6}\vec{I_N} - \frac{1}{3}\vec{I_C}. \tag{30}$$

In still another embodiment using only $I_A$, $I_B$ and $I_N$, the current vectors, $\vec{I_{CB}}, \vec{I_{CA}}, \vec{I_{BN}},$ and $\vec{I_{AN}}$ may also be determined:

$$\vec{I_{CB}} = -\frac{1}{3}\vec{I_A} - \frac{1}{2}\vec{I_N} - \frac{2}{3}\vec{I_B}. \tag{31}$$

$$\vec{I_{CA}} = -\frac{1}{3}\vec{I_B} - \frac{1}{2}\vec{I_N} - \frac{2}{3}\vec{I_A}. \tag{32}$$

$$\vec{I_{BN}} = \frac{1}{3}\vec{I_B} - \frac{1}{2}\vec{I_N} - \frac{1}{3}\vec{I_A}. \tag{33}$$

$$\vec{I_{AN}} = \frac{1}{3}\vec{I_A} - \frac{1}{2}\vec{I_N} - \frac{1}{3}\vec{I_B}. \tag{34}$$

It will be appreciated that equation (14) employs the magnitudes of the various vector values discussed above. The processing circuit 116 actually generates the magnitudes of the vector values $\vec{I_{CB}}, \vec{I_{CA}}, \vec{I_{BN}},$ and $\vec{I_{AN}}$, such as those used in equation (14), using the following steps: obtaining contemporaneous samples of the relevant three or four of $I_A$, $I_B$, $I_C$, $I_N$, adding the contemporaneous samples in accordance with the relevant four equations of the equations (15) to (34), squaring the sum, repeating the above and accumulating the squared sum values over several sample times, and then taking the square-root.

Figure 3A:
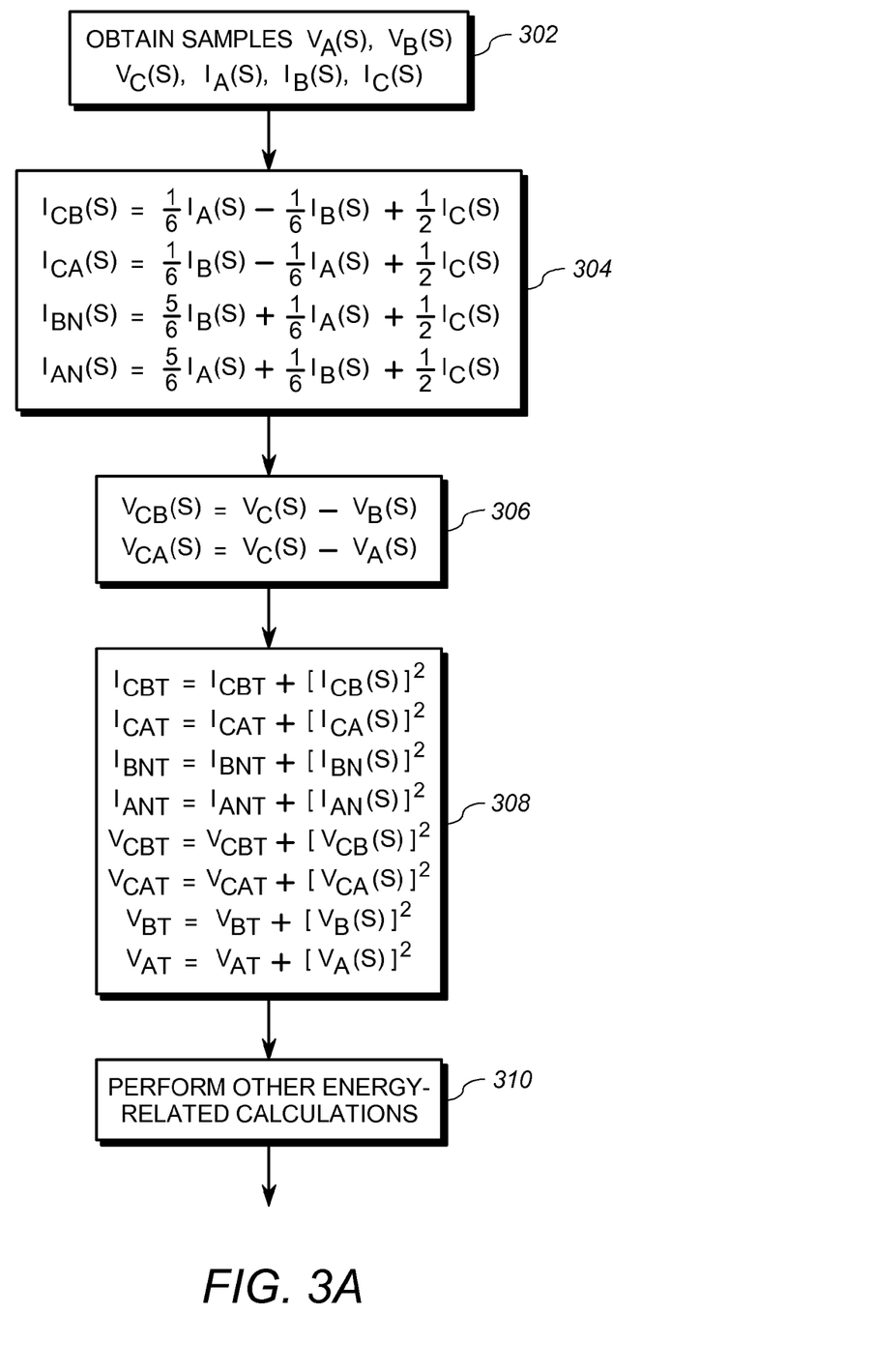
FIGS. 3A-3C show a flow diagram of the operation of a processing circuit of an arrangement for calculating VA in accordance with at least one embodiment of the present invention.
Figure 3B:
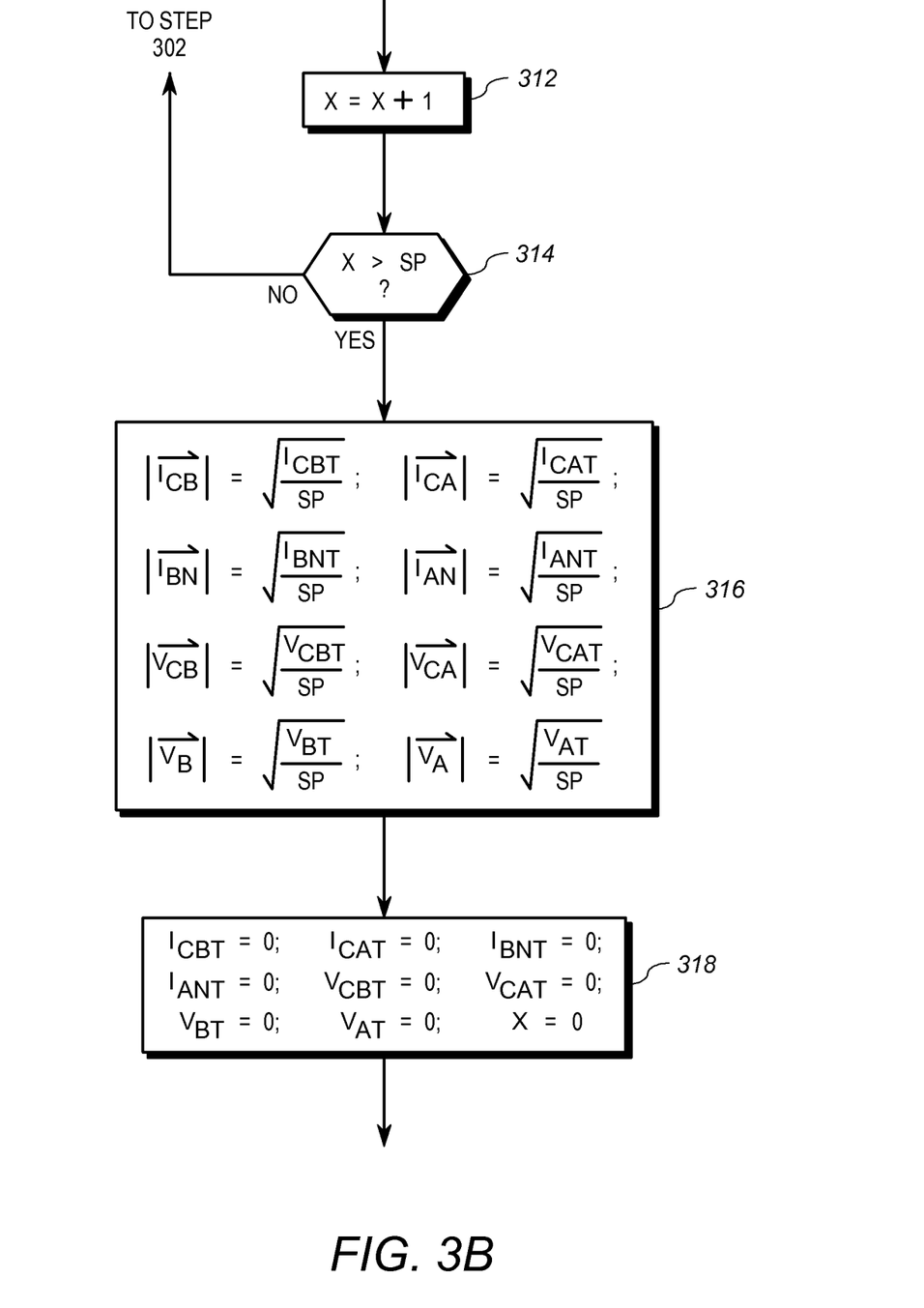
Figure 3C:
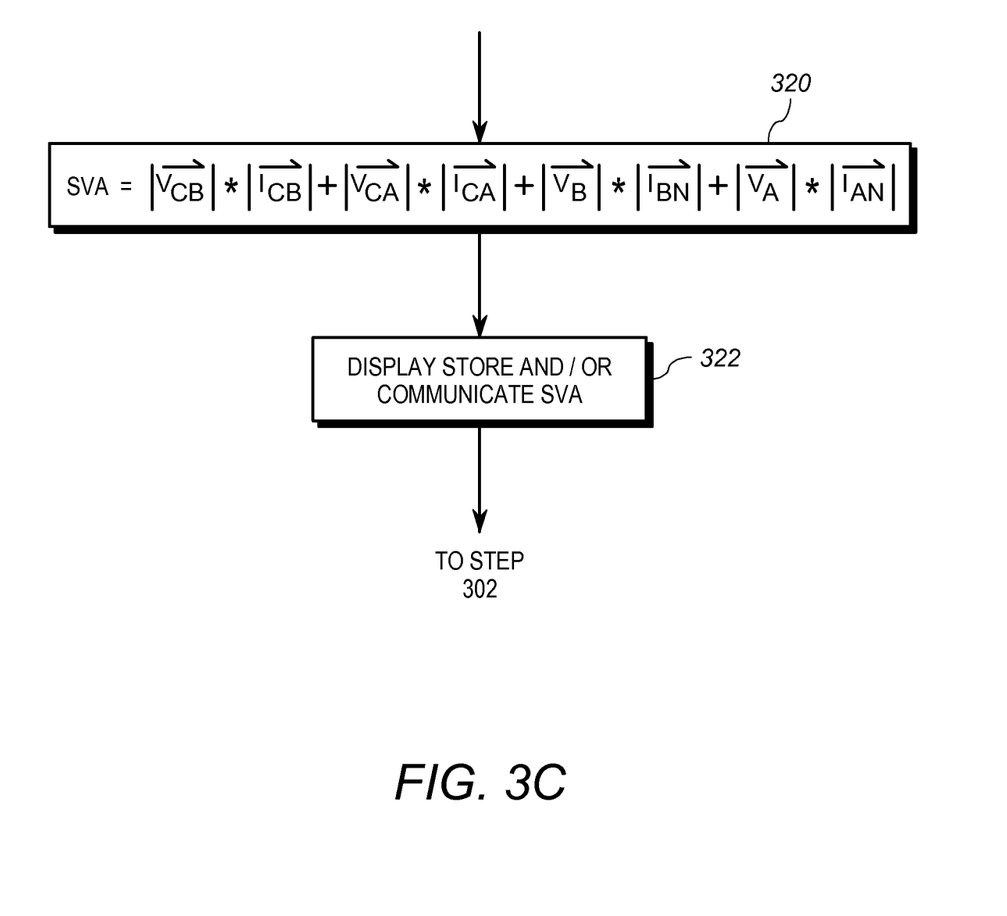

For example, FIGS. 3A-3C show an exemplary set of operations of the processing circuit 116 of the meter 10 including those that determine SVA per equation (14), using the values of equations (15)-(18) for generating the magnitude of the source currents current values $\vec{I_{CB}}, \vec{I_{CA}}, \vec{I_{BN}},$ and $\vec{I_{AN}}$. It will be appreciated that the operations of FIGS. 3A-3C may readily by modified to implement any of the equations (19)-(34) in obtaining a solution for equation (14). The operations of FIG. 3A-3C further show, at least in context the processing of samples to generate other metering values. As noted above, the processing circuit 116 preferably generates multiple metering values, such as watt-hr, VAR-hr, RMS voltage, RMS current, as well as the VA calculations.

Referring now to FIG. 3A, in step 302, the processing circuit 116 obtains contemporaneous samples $V_A(s)$, $V_B(s)$, $V_C(s)$, $I_A(s)$, $I_B(s)$, $I_C(s)$ for a sample time s. To this end, the processing circuit 116 obtains samples of the $V_A(s)$, $V_B(s)$, $V_C(s)$, $I_A(s)$, $I_B(s)$ and $I_C(s)$ from the ADC circuit 114. The processing circuit 116 then proceeds to step 304. In step 304, the processing circuit 116 generates source current samples $I_{CB}(s)$, $I_{CA}(s)$, $I_{BN}(s)$ and $I_{AN}(s)$ for the sample time s based on the equations (15)-(18). Specifically, the processing circuit 116 performs the following calculations:

$$I_{CB}(s) = \tfrac{1}{6}I_A(s) - \tfrac{1}{6}I_B(s) + \tfrac{1}{2}I_C(s) \tag{35}$$

$$I_{CA}(s) = \tfrac{1}{6}I_B(s) - \tfrac{1}{6}I_A(s) + \tfrac{1}{2}I_C(s) \tag{36}$$

$$I_{BN}(s) = \tfrac{5}{6}I_B(s) + \tfrac{1}{6}I_A(s) + \tfrac{1}{2}I_C(s) \tag{37}$$

$$I_{AN}(s) = \tfrac{5}{6}I_A(s) + \tfrac{1}{6}I_B(s) + \tfrac{1}{2}I_C(s) \tag{38}$$

In step 306, the processing circuit 116 further generates the contemporaneous samples of the $V_{CB}$ and $V_{CA}$ using the equations:

$$V_{CB}(s) = V_C(s) - V_B(s) \tag{39}$$

$$V_{CA}(s) = V_C(s) - V_A(s) \tag{40}$$

Thereafter, the processing circuit 116 proceeds to step 308. In step 308, the processing circuit 116 squares each of the values generated in steps 304 and 306, as well as $V_B(s)$ and $V_A(s)$, and adds the resulting squared value of to an ongoing accumulation of corresponding values, $I_{CBT}$, $I_{CAT}$, $I_{BNT}$, $I_{ANT}$, $V_{CBT}$, $V_{CAT}$, $V_{BT}$, $V_{AT}$. In other words, the processing circuit performs the following operations:

$$I_{CBT} = I_{CBT} + [I_{CB}(s)]^2 \tag{40}$$

$$I_{CAT} = I_{CAT} + [I_{CA}(s)]^2 \tag{41}$$

$$I_{BNT} = I_{BNT} + [I_{BN}(s)]^2 \tag{42}$$

$$I_{ANT} = I_{ANT} + [I_{AN}(s)]^2 \tag{43}$$

$$V_{CBT} = V_{CBT} + [V_{CB}(s)]^2 \tag{44}$$

$$V_{CAT} = V_{CAT} + [V_{CA}(s)]^2 \tag{45}$$

$$V_{BT} = V_{BT} + [V_B(s)]^2 \tag{46}$$

$$V_{AT} = V_{AT} + [V_A(s)]^2 \tag{47}$$

Thereafter, in step 310, the processing circuit 116 makes further calculations for the purposes of generating (i.e. updating) other energy consumption values, such as those representative of watts, watt-hours, RMS current, RMS voltage and the like. The calculation of such values based on the ongoing sample stream of $V_A(s)$, $V_B(s)$, $V_C(s)$, $I_A(s)$, $I_B(s)$, $I_C(s)$ is known in the art and may take different formats. The processing circuit 116 may also calculate load VA or vector VA as discussed further above.

Thereafter, in step 312, the processing circuit 116 increments a counter x. The counter x is used to determine whether to actually perform the next SVA calculation, as will be discussed below. In particular, it is useful to have samples from multiple cycles of the AC waveform before calculating the SVA value. After step 312, the processing circuit 116 proceeds to step 314.

In step 314, the processing circuit 116 determines whether x is greater than a sample threshold sp. If not, then the processing circuit 116 returns to step 302 and awaits the next set of samples $V_A(s)$, $V_B(s)$, $V_C(s)$, $I_A(s)$, $I_B(s)$, $I_C(s)$, wherein s has been incremented for the next sampling period of the ADC 114. In this embodiment, the value of sp is 504, and the sampling rate (ssec) is 2520, which produces a measurement period of 200 ms.

If, however, the processing circuit 116 determines that x is greater than a sample threshold sp, then the processing circuit 116 proceeds to step 316 to begin the source VA calculation. Specifically, in step 316, the processing circuit 116 generates the following vector magnitude values:

$$|\vec{I_{CB}}| = \sqrt{\frac{I_{CBT}}{sp}} \qquad (48)$$

$$|\vec{I_{CA}}| = \sqrt{\frac{I_{CAT}}{sp}} \qquad (49)$$

$$|\vec{I_{BN}}| = \sqrt{\frac{I_{BNT}}{sp}} \qquad (50)$$

$$|\vec{I_{AN}}| = \sqrt{\frac{I_{ANT}}{sp}} \qquad (51)$$

$$|\vec{V_{CB}}| = \sqrt{\frac{V_{CBT}}{sp}} \qquad (52)$$

$$|\vec{V_{CA}}| = \sqrt{\frac{V_{CAT}}{sp}} \qquad (53)$$

$$|\vec{V_B}| = \sqrt{\frac{V_{BT}}{sp}} \qquad (54)$$

$$|\vec{V_A}| = \sqrt{\frac{V_{AT}}{sp}} \qquad (55)$$

After step 316, the processing circuit 116 proceeds to step 318.

In step 318, the processing circuit 116 resets the counter x to zero, and also resets the values $I_{CBT}$, $I_{CAT}$, $I_{BNT}$, $I_{ANT}$, $V_{CBT}$, $V_{CAT}$, $V_{BT}$, $V_{AT}$ to zero. The processing circuit 116 thereafter proceeds to step 320. In step 320, the processing circuit 116 performs the calculation of equation (14) based on the values generated in step 316. In other words the processing circuit 116 generates SVA as follows:

$$SVA = VA = |\vec{V_{CB}}|*|\vec{I_{CB}}| + |\vec{V_{CA}}|*|\vec{I_{CA}}| + |\vec{V_B}|*|\vec{I_{BN}}| + |\vec{V_A}|*|\vec{I_{AN}}| \qquad (14)$$

Thereafter, in step 322, the processing circuit 116 stores, displays or otherwise communicates the determined SVA value. In particular, the processing circuit 116 may suitably store the SVA value in the data store 112, display the SVA value using the display 120, and/or communicate the SVA value to a remote device, such as a utility computer, not shown, using the communication circuit 118.

The processing circuit 116 may employ the stored SVA value for further calculations. For example, the processing circuit 116 may further filter the SVA value by averaging several consecutive SVA values, such as five or ten of such values. In some embodiments, it is the average SVA value that is displayed or communicated.

The processing circuit 116 may also accumulate the stored SVA values calculated over time, multiplied by the corresponding time periods, to generate a source VA-hr value. The processing circuit 116 may also store in the memory 116 an SVA value for each of a plurality of time periods in conjunction with a time-of-use metering function. In such a case, the processing circuit 116 stores either an average SVA (VA), or an accumulated SVA (VAh), for each time period of a set of time periods for each day.

In any event, after step 322, the processing circuit 116 returns to step 302 and proceeds accordingly.

It will be appreciated that the embodiment described above may readily be adapted to calculate source VA for a three-wire delta electrical service. A three-wire delta service is similar to a four-wire delta service except that no separate neutral line is provided. Instead, the phase B line 214 is used as the neutral line.

To adapt the calculations discussed above for three-wire delta, the processing circuit 116 can use equation (14) set forth above, and any of the sets of equations discussed above, wherein $I_B$ is set to $-I_A - I_C$ (e.g. $I_B(s) = I_A(s) - I_C(s)$) and $I_N = 0$. While a suitable method for calculating source VA in a three-wire delta system is disclosed in U.S. Pat. No. 7,747,400, the embodiment described herein allows for the same general sets of equations to be used for both three-wire delta and four-wire delta systems, with only two extra (and simple) operations added. As a result, the meter 10 can be readily made adaptable to both systems with effectively one set of equations.

It will be appreciated that the processing circuit 116 of the meter 10 may also provide load VA as well as any other energy consumption-related values to the display 120 or to the communication circuit 118 for transmission to an external device. In some cases, the processing circuit 116 provides the VA information to a billing calculation unit (such as a billing formula implemented by the processing circuit itself) so that billing calculations may be made, for example, in a conventional manner.

It will be appreciated that the above describe embodiments are merely illustrative, and that those of ordinary skill in the art may readily devise their own modifications and implementations that incorporate the principles of the present invention and fall within the spirit and scope thereof.

I claim:

1. An arrangement in a meter connected between a source and a load, comprising:
    a) an A/D converter configured to generate digital samples of voltage and current waveforms in a polyphase electrical system;
    b) a processing circuit operably coupled to receive the digital samples from the A/D converter, the processing circuit configured to:
        i) obtain contemporaneous samples of $V_A$, $V_B$, $V_C$, and at least three of $I_A$, $I_B$, $I_C$, and $I_N$, where $I_A$ is a current measurement signal of phase A, $I_B$ is a current measurement signal of phase B, $I_C$ is a current measurement signal of phase C, $I_N$ is a current measurement signal of a neutral connection, $V_A$ is a voltage measurement signal from phase A to neutral, $V_B$ is a voltage measurement signal from phase B to neutral, and $V_C$ is a voltage measurement signal from phase C to neutral;
        ii) determine an $I_{CB}$ sample value based on contemporaneous samples of at least three of $I_A$, $I_B$, $I_C$, and $I_N$;
        iii) determine an $I_{CA}$ sample value based on contemporaneous samples of at least three of $I_A$, $I_B$, $I_C$, and $I_N$;
        iv) determine an $I_{BN}$ sample value based on contemporaneous samples of at least three of $I_A$, $I_B$, $I_C$, and $I_N$;
        v) determine an $I_{AN}$ sample value based on contemporaneous samples of at least three of $I_A$, $I_B$, $I_C$, and $I_N$;
        vi) determine a VA value based at least in part on $I_{CB}$, $I_{CA}$, $I_{BN}$ and $I_{AN}$; and vii) provide information representative of the VA calculation to one of a group consisting of a display, a communication circuit, a memory and a billing calculation unit.

2. The arrangement of claim 1, wherein the processing circuit is further configured to generate:
   a) The $I_{CB}$ sample value based on the equation $\frac{1}{6}I_A - \frac{1}{6}I_B + \frac{1}{2}I_C$;
   b) The $I_{CA}$ sample value based on the equation $\frac{1}{6}I_B - \frac{1}{6}I_A + \frac{1}{2}I_C$;
   c) The $I_{BN}$ sample value based on the equation $\frac{5}{6}I_B + \frac{1}{6}I_A + \frac{1}{2}I_C$; and
   d) The $I_{AN}$ sample value based on the equation $\frac{5}{6}I_A + \frac{1}{6}I_B + \frac{1}{2}I_C$.

3. The arrangement of claim 1, wherein the processing circuit is further configured to:
   a) generate a plurality of each of the $I_{CB}$, $I_{CA}$, $I_{BN}$ and $I_{AN}$ sample values; and
   b) generate a magnitude value for each of the plurality of the $I_{CB}$, $I_{CA}$, $I_{BN}$ and $I_{AN}$ sample values.

4. The arrangement of claim 3, wherein the processing circuit is further configured to determine the VA value further based at least in part on the $I_{CB}$ magnitude value, the $I_{CA}$ magnitude value, the $I_{BN}$ magnitude value, and the $I_{AN}$ magnitude value.

5. The arrangement of claim 4, wherein the processing circuit is further configured to determine the VA value further based in part on a magnitude of a voltage difference from phase C to phase B and a magnitude of a voltage difference from phase C to phase A.

6. The arrangement of claim 5, wherein the processing circuit is further configured to determine the magnitude of the voltage from phase C to phase B and determine the magnitude of the voltage from phase C to phase A by:
   a) generating a plurality of the $V_{CB}$ sample values, each $V_{CB}$ sample value comprising a difference between a phase C sample and a contemporaneous phase B sample; and
   b) generating a $V_{CB}$ magnitude value using the plurality of the $V_{CB}$ sample values;
   c) generating a plurality of the $V_{CA}$ sample values, each $V_{CA}$ sample value comprising a difference between a phase C sample and a contemporaneous phase A sample;
   d) generating a $V_{CA}$ magnitude value using the plurality of the $V_{CA}$ sample values.

7. The arrangement of claim 5, wherein the processing circuit is further configured to generate the VA value based on the equation:

$$VA = |\vec{V_{CB}}| * |\vec{I_{CB}}| + |\vec{V_{CA}}| * |\vec{I_{CA}}| + |\vec{V_B}| * |\vec{I_{BN}}| + |\vec{V_A}| * |\vec{I_{AN}}|$$

wherein $|\vec{V_{CB}}|$ is the $V_{CB}$ magnitude value, $|\vec{I_{CB}}|$ is the $I_{CB}$ magnitude value, $|\vec{V_{CA}}|$ is the $V_{CA}$ magnitude value, $|\vec{I_{CA}}|$ is the $I_{CA}$ magnitude value, $|\vec{V_B}|$ is a magnitude of the voltage from phase B to neutral, $|\vec{I_{BN}}|$ is the $I_{BN}$ magnitude value, $|\vec{V_A}|$ is a magnitude of the voltage from phase A to neutral, and $|\vec{I_{AN}}|$ is a vector value representative of the current from phase A to neutral.

8. The arrangement of claim 1, further comprising the display, and wherein the display is configured to display the information representative of the VA calculation.

9. An arrangement in a meter connected between a source and a load, comprising:
   a) an A/D converter configured to generate digital samples of voltage and current waveforms in a polyphase electrical system;
   b) a processing circuit operably coupled to receive the digital samples from the A/D converter, the processing circuit configured to:
      i) obtain samples of $V_A$, $V_B$, $V_C$, and at least three of $I_A$, $I_B$, $I_C$, and $I_N$, where $I_A$ is a current measurement signal of phase A, $I_B$ is a current measurement signal of phase B, $I_C$ is a current measurement signal of phase C, $I_N$ is a current measurement signal of a neutral connection, $V_A$ is a voltage measurement signal from phase A to neutral, $V_B$ is a voltage measurement signal from phase B to neutral, and $V_C$ is a voltage measurement signal from phase C to neutral;
      ii) determine, based on the obtained samples, a magnitude value $|\vec{V_{CB}}|$ of a voltage from phase C to phase B, a magnitude value $|\vec{I_{CB}}|$ of a source current from phase C to phase B, a magnitude value $|\vec{V_{CA}}|$ of a voltage from phase C to phase A, a magnitude value $|\vec{I_{CA}}|$ of a source current from phase C to phase A, a magnitude value $|\vec{V_B}|$ of a voltage from phase B to neutral, a magnitude value $|\vec{I_{BN}}|$ of a source current from phase B to neutral, a magnitude value $|\vec{V_A}|$ of a voltage from phase A to neutral, and a magnitude value $|\vec{I_{AN}}|$ of a source current from phase A neutral;
      iii) generate the VA value based on the equation $$VA = |\vec{V_{CB}}| * |\vec{I_{CB}}| + |\vec{V_{CA}}| * |\vec{I_{CA}}| + |\vec{V_B}| * |\vec{I_{BN}}| + |\vec{V_A}| * |\vec{I_{AN}}|;$$

and
      iv) provide information representative of the VA calculation to one of a group consisting of a display, a communication circuit, a memory and a billing calculation unit.

10. The arrangement of claim 9, wherein the processing circuit is further configured to determine the value $|\vec{I_{CB}}|$ based on samples of at least three of $I_A$, $I_B$, $I_C$, and $I_N$.

11. The arrangement of claim 10, wherein the processing circuit is further configured to determine the value $|\vec{I_{CA}}|$ based on samples of at least three of $I_A$, $I_B$, $I_C$, and $I_N$.

12. The arrangement of claim 9, wherein the processing circuit is further configured to determine the value $|\vec{I_{BN}}|$ based on samples of at least three of $I_A$, $I_B$, $I_C$, and $I_N$.

13. The arrangement of claim 12, wherein the processing circuit is further configured to determine the value $|\vec{I_{AN}}|$ based on samples of at least three of $I_A$, $I_B$, $I_C$, and $I_N$.

14. An arrangement in a meter connected between a source and a load, comprising:
   a) an A/D converter configured to generate digital samples of voltage and current waveforms in a polyphase electrical system;
   b) a processing circuit operably coupled to receive the digital samples from the A/D converter, the processing circuit configured to:

i) obtain contemporaneous samples of $V_A, V_B, V_C$, and at least three of $I_A, I_B, I_C$, and $I_N$, where $I_A$ is a current measurement signal of phase A, $I_B$ is a current measurement signal of phase B, $I_C$ is a current measurement signal of phase C, $I_N$ is a current measurement signal of a neutral connection, $V_A$ is a voltage measurement signal from phase A to neutral, $V_B$ is a voltage measurement signal from phase B to neutral, and $V_C$ is a voltage measurement signal from phase C to neutral;

ii) determine a $I_{CB}$ sample value based on contemporaneous samples of the at least three of $I_A, I_B, I_C$, and $I_N$;

iii) determine a VA value based at least in part on $I_{CB}$; and iv) provide information representative of the VA calculation to one of a group consisting of a display, a communication circuit, a memory and a billing calculation unit.

15. The arrangement of claim 14, wherein the processing circuit is further configured to generate the $I_{CB}$ sample value based on the equation $\frac{1}{6}I_A - \frac{1}{6}I_B + \frac{1}{2}I_C$.

16. The arrangement of claim 15, wherein the processing circuit is further configured to:

generate a plurality of the $I_{CB}$ sample values;

generate a magnitude value of the plurality of the $I_{CB}$ sample values; and determine the VA value based at least in part on the produce of the generated magnitude value and a magnitude of a voltage from phase C to phase B.

\* \* \* \* \*